(12) United States Patent
Choi

(10) Patent No.: US 6,207,495 B1
(45) Date of Patent: Mar. 27, 2001

(54) METHOD OF FABRICATING CAPACITORS

(75) Inventor: Sung-Wook Choi, Cheongju (KR)

(73) Assignee: Hyundai Electronic Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/636,632

(22) Filed: Aug. 11, 2000

(30) Foreign Application Priority Data

Aug. 23, 1999 (KR) .................................................. 99-34965

(51) Int. Cl.$^7$ ................................................ H01L 21/8242
(52) U.S. Cl. ............................................. 438/250; 438/393
(58) Field of Search ........................... 438/238, 250–256, 438/381, 390–399

(56) References Cited

U.S. PATENT DOCUMENTS 6,096,600 * 8/2000 Azami ................................... 438/250
6,146,906 * 11/2000 Inoue et al. ............................. 438/3

* cited by examiner

Primary Examiner—Jey Tsai
(74) Attorney, Agent, or Firm—Morgan, Lewis & Bockius LLP

(57) ABSTRACT

The present invention related to a method of fabricating capacitors which fabricates a plurality of capacitors of which capacitances are different one another on a semiconductor substrate. The present invention includes the steps of forming a field insulating layer providing an active area of a device in a field area on a semiconductor substrate, forming a first polysilicon layer and a first dielectric substance layer on the semiconductor substrate successively to cover the field insulating layer, forming a first dielectric layer over one stage of the field insulating layer by patterning the first dielectric substance layer, forming a second dielectric substance layer to cover the first dielectric layer on the first polysilicon layer, forming a first lower electrode and a second dielectric layer over the stage of the field insulating layer as well as forming a second lower electrode and the second dielectric layer over the other stage of the field insulating layer by patterning the second dielectric substance layer and the first polysilicon layer wherein the first dielectric layer is inserted between the first lower electrode and the second dielectric layer, forming a second polysilicon layer on the second dielectric layer, and forming a first and a second upper electrode by patterning the second polysilicon layer.

7 Claims, 4 Drawing Sheets

METHOD OF FABRICATING CAPACITORS

BACKGROUND OF THE INVENTION

1. Field of Invention

The present invention related to a method of fabricating capacitors which fabricates a plurality of capacitors of which capacitances are different one another on a semiconductor substrate.

2. Discussion of Related Art

In semiconductor devices, a memory device requires capacitors of which sizes are large for storing a lot of data. Thus, effective area for capacitance is increased by forming a three-dimensional structure such as the stacked, the trench-typed structure and the like to store large amount of data as well as the area occupied by an unit cell is reduced.

However, logic devices change impedance constantly according to frequencies of inputted signals which are operated by the signals which are constituted by digital and analog signals, thereby requiring no such capacitors as have large capacitance. Therefore, capacitors in logic devices are formed two-dimensionally on field oxide layers defining active areas of the devices. FIG. 1A to FIG. 1C show cross-sectional views of fabricating a capacitor according to a related art.

Referring to FIG. 1A, a field insulating layer 13 forming an active area of a device is formed in a field area on a semiconductor substrate 11. In this case, the field insulating layer 13 is formed by LOCOS(local oxidation of silicon) or STI(shallow trench isolation).

A first polysilicon layer 15 is formed on the semiconductor substrate 11 to cover the field insulating layer 13 by depositing polysilicon doped with impurities by CVD (hereinafter abbreviated CVD). And, a dielectric layer 17 having an ONO structure is formed by depositing silicon oxide, silicon nitride, and silicon oxide on the first polysilicon layer 15 successively by CVD. Referring to FIG. 1B, the dielectric layer 17 and first polysilicon layer 15 are patterned to expose the semiconductor substrate 11 and field insulating layer 13 by photolithography. In this case, the polysilicon layer 15 and the dielectric layer 17 which are not etched but remain become a lower electrode 16 of a capacitor and a dielectric, respectively.

A second polysilicon layer 18 is formed on the semiconductor substrate 11 by depositing polysilicon doped with impurities to cover the field insulating layer 13, lower electrode 16, and dielectric layer 17 by CVD.

Referring to FIG. 1C, an upper electrode 19 is formed by patterning the second polysilicon layer 18 only to remain on the dielectric layer 17 to expose the semiconductor substrate 11 and field insulating layer 13 by photolithography. Thus, the upper electrode 19 constitutes a capacitor with the lower electrode 16 and dielectric layer 17.

As mentioned in the above description, the related art fabricates a capacitor by forming a first polysilicon layer and a dielectric layer on a semiconductor substrate to cover a field insulating layer in order, by forming a lower electrode by means of patterning the layers by photolithography, by forming a second polysilicon layer on the semiconductor substrate to cover the lower electrode and dielectric layer, then by forming an upper electrode by means of patterning the second polysilicon layer to remain on the dielectric layer by photolithography.

Unfortunately, it is difficult to fabricate a plurality of capacitors of various capacitances on the same substrate in the related art because thickness of the dielectric layer is uniform.

SUMMARY OF THE INVENTION

Accordingly, the present invention is directed to a method of fabricating capacitors that substantially obviate one or more of the problems due to limitations and disadvantages of the related art.

The object of the present invention is to provide a method of fabricating capacitors which enables to fabricate a plurality of capacitors of which capacitances are various on the very substrate. Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a field insulating layer providing an active area of a device in a field area on a semiconductor substrate, forming a first polysilicon layer and a first dielectric substance layer on the semiconductor substrate successively to cover the field insulating layer, forming a first dielectric layer over one stage of the field insulating layer by patterning the first dielectric substance layer, forming a second dielectric substance layer to cover the first dielectric layer on the first polysilicon layer, forming a first lower electrode and a second dielectric layer over the stage of the field insulating layer as well as forming a second lower electrode and the second dielectric layer over the other stage of the field insulating layer by patterning the second dielectric substance layer and the first polysilicon layer wherein the first dielectric layer is inserted between the first lower electrode and the second dielectric layer, forming a second polysilicon layer on the second dielectric layer, and forming a first and a second upper electrode by patterning the second polysilicon layer.

In another aspect, the present invention includes the steps of forming a field insulating layer providing an active area of a device in a field area on a semiconductor substrate, forming a first polysilicon layer and a first dielectric substance layer successively on the semiconductor substrate to cover the field insulating layer, forming a first dielectric layer over one stage of the field insulating layer by patterning the first dielectric substance layer, forming a second dielectric substance layer and a second polysilicon layer to cover the first dielectric layer successively on the first polysilicon layer, forming a common lower electrode by patterning the second polysilicon layer, second dielectric substance layer, and first polysilicon layer just to remain over the field insulating layer wherein the common lower electrode is defined the remaining first polysilicon layer, forming a second dielectric layer and a first upper electrode on one stage of the common lower electrode as soon as forming a second dielectric layer and a second upper electrode on the other stage of the common lower electrode by patterning the second polysilicon layer and second dielectric substance layer to expose a middle part of the common lower electrode wherein the first dielectric layer is inserted between the second dielectric layer and the common lower electrode. It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention. In the drawings.

DETAILED DESCRIPTION OF PREFERRED EMBODIMENTS

Reference will now be made in detail to the preferred embodiments of the present invention, examples of which are illustrated in the accompanying drawings.

FIG. 2A to FIG. 2D show cross-sectional views of fabricating capacitors according to a first embodiment of the present invention.

Figure 1A:
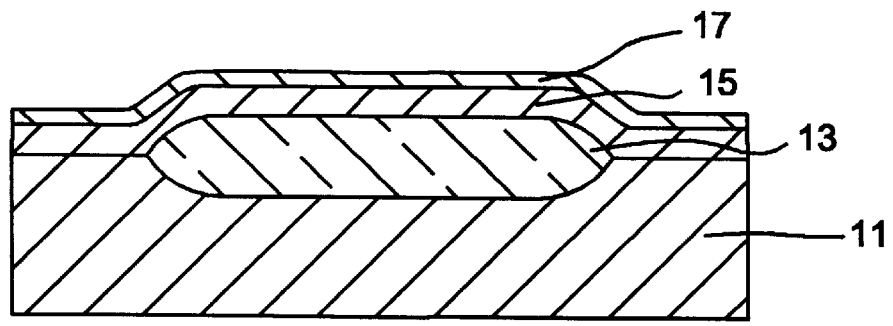
FIG. 1A to FIG. 1C show cross-sectional views of fabricating a capacitor according to a related art.
Figure 1B:
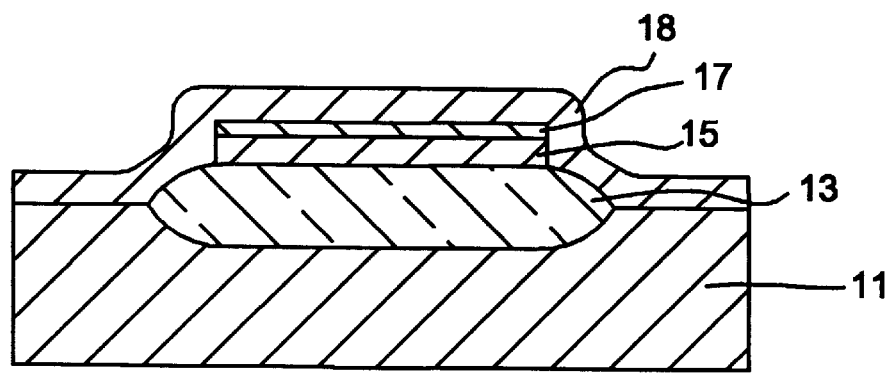
Figure 1C:
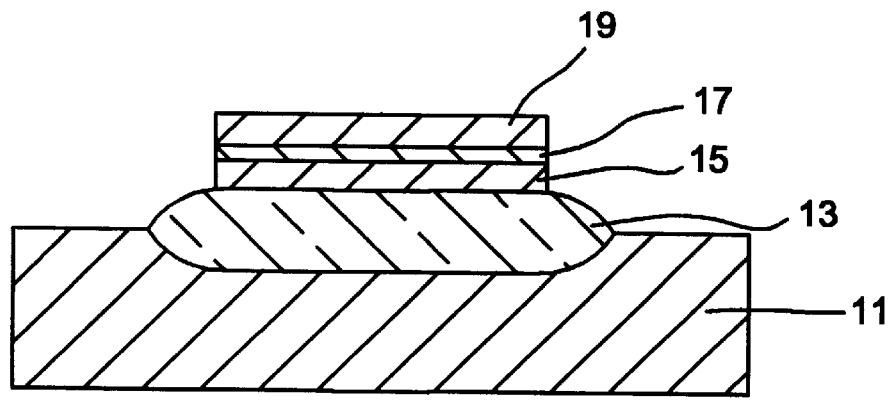
Figure 2A:
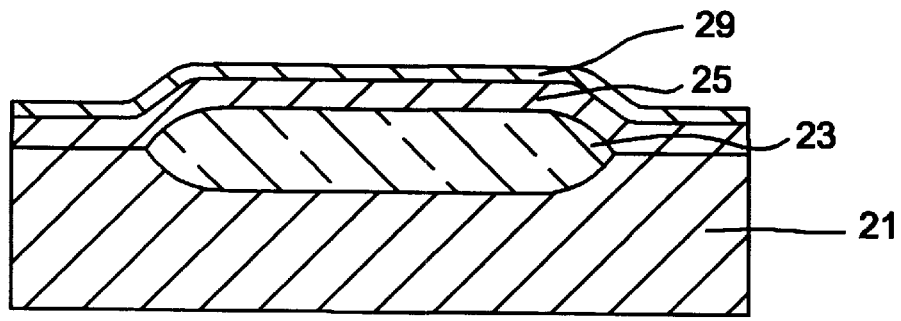
FIG. 2A to FIG. 2D show cross-sectional views of fabricating capacitors according to a first embodiment of the present invention.

Referring to FIG. 2A, a field insulating layer 23 forming an active area of a device is formed in a field area on a semiconductor substrate 21. In this case, the field insulating layer 23 is formed by LOCOS or STI.

A first polysilicon layer 25 1500 to 4000 Å thick is formed on the semiconductor substrate 21 to cover the field insulating layer 23 by depositing polysilicon doped with impurities by CVD. And, a dielectric substance layer 29 having an ONO structure is formed by depositing silicon oxide, silicon nitride, and silicon oxide on the first polysilicon layer 15 successively by CVD.

Figure 2B:
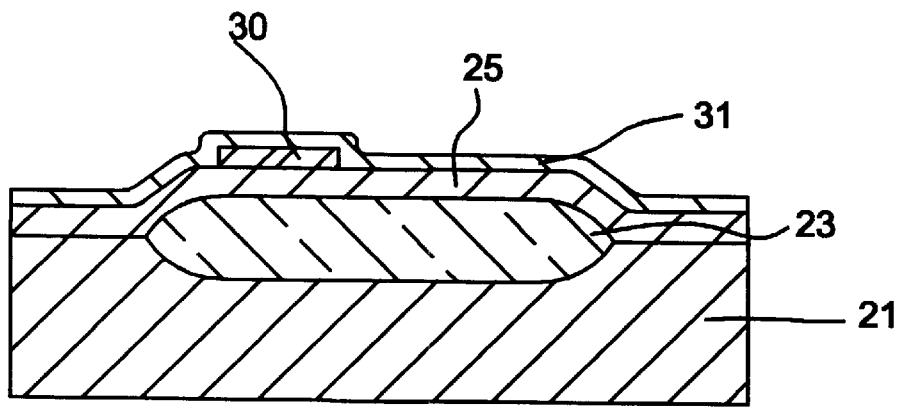

Referring to FIG. 2B, a first dielectric layer 30 is formed by patterning the first dielectric substance layer 29 to expose the first polysilicon layer 25 except a portion corresponding to one stage of the field insulating layer 23 by photolithography.

A second dielectric substance layer 25 is formed to cover the first dielectric layer 30 remaining on the first polysilicon layer 25. The second dielectric substance layer 31 is formed by the same method and thickness of the first dielectric substance layer 29.

Figure 2C:
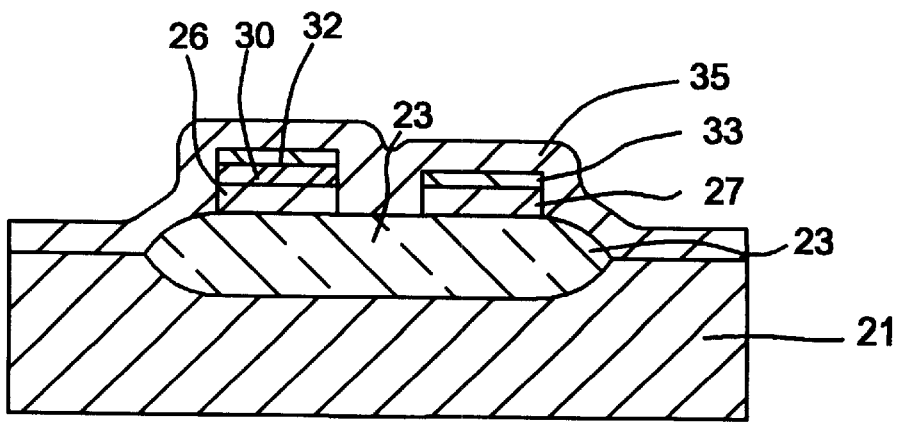

Referring to FIG. 2C, the second dielectric substance layer 31 and first polysilicon layer 25 are patterned to remain on one stage of the field insulating layer 23 where the first dielectric layer 30 has been formed and on the other stage of the field insulating layer 23 by photolithography including anisotropic etches such as reactive ion etching(hereinafter abbreviated RIE), etc, thereby exposing portions of the semiconductor substrate 21 and field insulating layer 23.

In this case, the remaining portions of the first polysilicon layer 25 become a first and a second lower electrode 26 and 27 and the remaining portions of the second dielectric substance layer 31 become second dielectric layers 32 and 33. Thus, the first and second dielectric layers 30 and 32 are stacked on the first lower electrode 26, while the second dielectric layer 33 is only stacked on the second lower electrode 27. Therefore, the first and second lower electrodes 26 and 27, the first dielectric layer 30, and the second dielectric layers 32 and 33 become lower electrodes and dielectrics of capacitors, respectively.

A second polysilicon layer 35 is formed on the semiconductor substrate 21 to cover the field insulating layer 23, first and second lower electrodes 26 and 27, and the first and second dielectric layers 30, 32, and 33 by depositing polysilicon doped with impurities 1500 to 4000 Å thick by CVD.

Figure 2D:
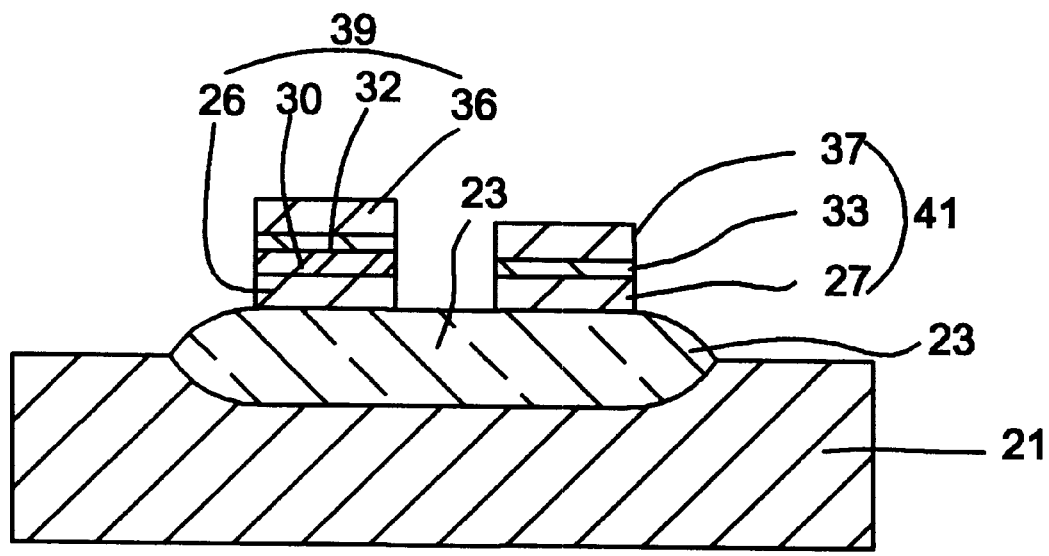

Referring to FIG. 2D, a first and a second upper electrodes 36 and 37 are formed to expose portions of the semiconductor substrate 21 and field insulating layer 23 by patterning the second polysilicon layer 35 to remain on the second dielectric layers 32 and 33 by photolithography including anisotropic etches such as RIE, etc.

In this case, the first upper electrode 36 constitutes a first capacitor 39 with the lower electrode 26 and the first and second dielectric layers 30 and 32, while the second upper electrode 37 does a second capacitor 41 with the second lower electrode 27 and second dielectric layer 33.

Thickness of a dielectric in the first capacitor 39 consisting of the first and second dielectric layers 30 and 32 on the first lower electrode 26 is different from that of the other dielectric of the second capacitor 41 having only the second dielectric layer 33 on the second lower electrode 27. Therefore, each dielectric provides capacitance which differs each other.

Figure 3A:
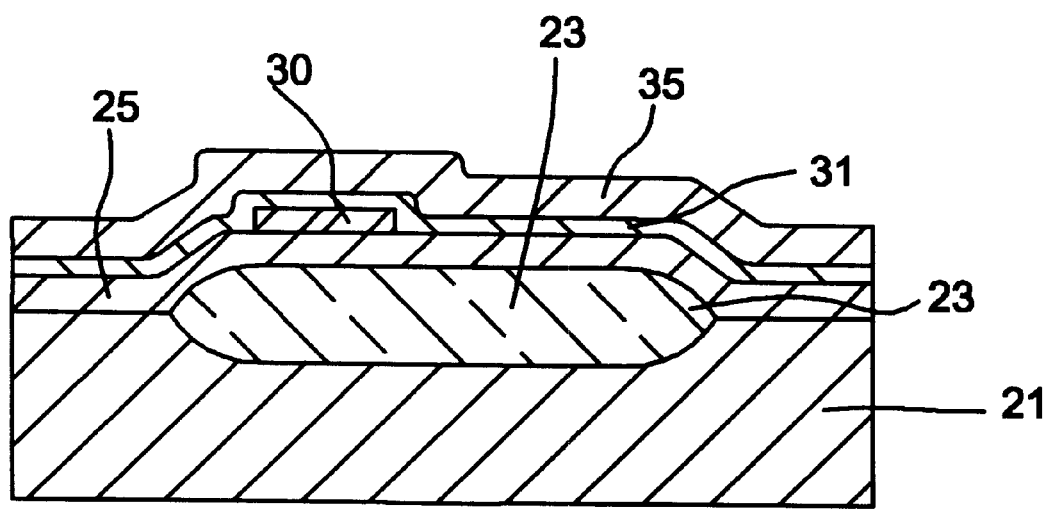
FIG. 3A to FIG. 3C show cross-sectional views of fabricating capacitors according to a second embodiment of the present invention.
Figure 3B:
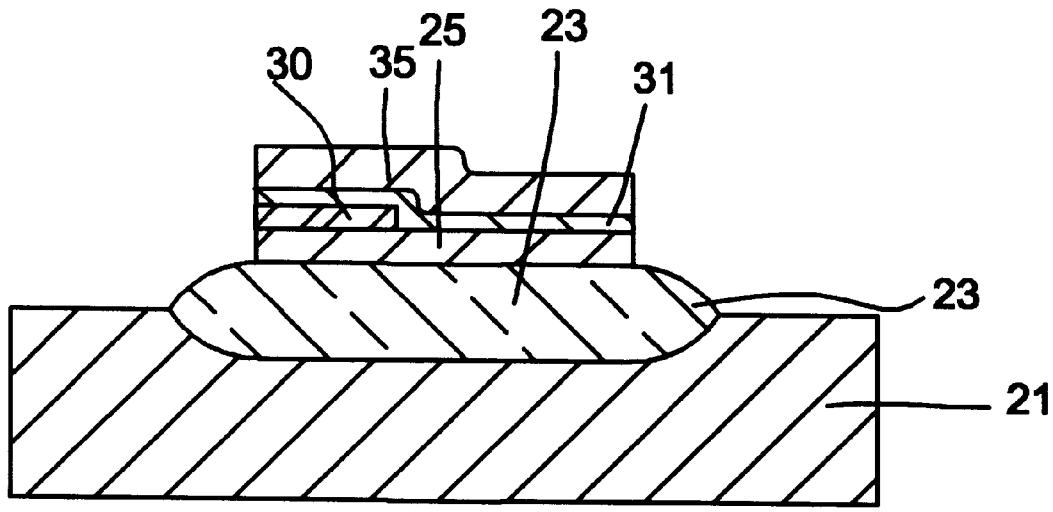
Figure 3C:
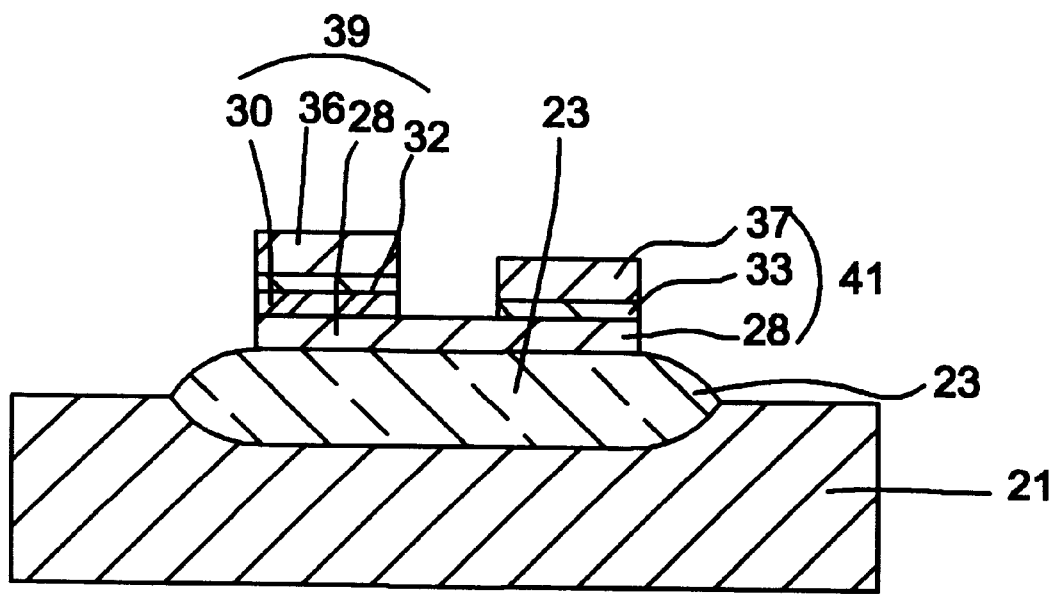

FIG. 3A to FIG. 3C show cross-sectional views of fabricating, capacitors according to a second embodiment of the present invention.

Referring to FIG. 3A, after the steps in FIG. 2B, a second polysilicon layer 35 1500 to 4000 Å thick is formed on the second dielectric substance layer 31 by depositing polysilicon doped with impurities by CVD.

Referring to FIG. 3B, the second polysilicon layer 35, second dielectric substance layer 31, and first polysilicon layer 25 are patterned to remain just on the field insulating layer 23 and to expose the semiconductor substrate 21 by photolithography. In this case, a first dielectric layer 30 and the second dielectric substance layer 32 remain on one stage of the first polysilicon layer 25, while the second dielectric substance layer 32 does just on the other stage of the first polysilicon layer 25. Referring to FIG. 3C, the second polysilicon layer 35 and second dielectric substance layer 31 are patterned to remain on one stage corresponding to the first dielectric layer 30 as well as on the other stage by exposing a middle part of the first polysilicon layer 28 by photolithography including anisotropic etches such as RIE, etc. In this case, portions of the second dielectric substance layer 31 and the second polysilicon layer 35 which are not etched but remain become a second dielectric 32 and 33 and a first and a second upper electrode 36 and 37, respectively. Besides, the first polysilicon layer 25 on the field insulating layer 23 becomes a common lower electrode 28 of capacitors.

Thus, the common lower electrode 28 constitutes a first capacitor 39 with the first and second dielectric layers 30 and 32 and the first upper electrode 36 as well as forms a second capacitor 41 with the second dielectric layer 33 and second upper electrode 37.

As thickness of the dielectric in the first capacitor 39 where the first and second dielectric layers 30 and 32 are formed on the common lower electrode 26 is different from that of the other electric of the second capacitor 41 having the second dielectric layer 33 only, each capacitance of the capacitors differs each other. Besides, the first and second capacitors 39 and 41 are connected each other in parallel since they share the common lower electrode 26.

In another embodiments of the present invention, at least two capacitors may be fabricated. As mentioned in the above description of the present invention, the first dielectric layer is formed only on the first polysilicon layer for forming a lower electrode corresponding to one stage of the field insulating layer, a second dielectric substance layer is formed to cover the first dielectric layer on the first polysilicon layer, and the second dielectric substance layer and first polysilicon layer are patterned such that the first and second dielectric layers remain on the first lower electrode constituting the first capacitor over one stage of the field insulating layer and that the other second dielectric layer remains only on the second lower electrode constituting the second capacitor over the other stage of the field insulating layer.

Accordingly, the present invention enables to fabricate a plurality of capacitors of which capacitances are various on the very substrate.

It will be apparent to those skilled in the art that various modifications and variations can be made in a method of fabricating capacitors of the present invention without departing from the spirit or scope of the inventions. Thus, it is intended that the present invention cover the modifications and variations of this invention provided they come within the scope of the appended claims and equivalents.

What is claimed is:

1. A method of fabricating capacitors comprising the steps of:

forming a field insulating layer providing an active area of a device in a field area on a semiconductor substrate;

forming a first polysilicon layer and a first dielectric substance layer on the semiconductor substrate successively to cover the field insulating layer;

forming a first dielectric layer over one stage of the field insulating layer by patterning the first dielectric substance layer;

forming a second dielectric substance layer to cover the first dielectric layer on the first polysilicon layer;

forming a first lower electrode and a second dielectric layer over the stage of the field insulating layer as well as forming a second lower electrode and the second dielectric layer over the other stage of the field insulating layer by patterning the second dielectric substance layer and the first polysilicon layer wherein the first dielectric layer is inserted between the first lower electrode and the second dielectric layer;

forming a second polysilicon layer on the second dielectric layer; and forming a first and a second upper electrode by patterning the second polysilicon layer.

2. The method of fabricating capacitors according to claim 1, wherein the field insulating layer is formed by local oxidation of silicon or by shallow trench isolation.

3. The method of fabricating capacitors according to claim 1, wherein the first and second polysilicon layers are formed to the thickness between 1500 and 4000 Å.

4. The method of fabricating capacitors according to claim 1, wherein the first and second dielectric substance layers are formed by depositing silicon oxide, silicon nitride, and silicon oxide in order.

5. The method of fabricating capacitors according to claim 4, wherein the silicon oxide, silicon nitride, and silicon oxide are formed to the thickness between 50 and 100 Å, between 150 and 200 Å, and between 200 and 300 Å, respectively.

6. The method of fabricating capacitors according to claim 1, wherein the first and second upper electrodes are formed by patterning the second polysilicon layer to remain on the second dielectric layer as well as to expose portions of the semiconductor substrate and the field insulating layer.

7. A method of fabricating capacitors comprising the steps of:

forming a field insulating layer providing an active area of a device in a field area on a semiconductor substrate;

forming a first polysilicon layer and a first dielectric substance layer successively on the semiconductor substrate to cover the field insulating layer;

forming a first dielectric layer over one stage of the field insulating layer by patterning the first dielectric substance layer;

forming a second dielectric substance layer and a second polysilicon layer to cover the first dielectric layer successively on the first polysilicon layer;

forming a common lower electrode by patterning the second polysilicon layer, second dielectric substance layer, and first polysilicon layer just to remain over the field insulating layer wherein the common lower electrode is defined the remaining first polysilicon layer;

forming a second dielectric layer and a first upper electrode on one stage of the common lower electrode as soon as forming a second dielectric layer and a second upper electrode on the other stage of the common lower electrode by patterning the second polysilicon layer and second dielectric substance layer to expose a middle part of the common lower electrode wherein the first dielectric layer is inserted between the second dielectric layer and the common lower electrode.

* * * * *